US012751155B2

(12) United States Patent
Li et al.

(10) Patent No.: US 12,751,155 B2
(45) Date of Patent: Sep. 29, 2026

(54) DISPLAY PANEL WITH RECESSED AREAS, DISPLAY APPARATUS AND MANUFACTURING METHOD THEREFOR

(71) Applicant: BOE Technology Group Co., Ltd., Beijing (CN)

(72) Inventors: Xiaohu Li, Beijing (CN); Huajie Yan, Beijing (CN); Zhiqiang Jiao, Beijing (CN); Lu Wang, Beijing (CN); Chuanxiang Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 536 days.

(21) Appl. No.: 18/275,809

(22) PCT Filed: Nov. 18, 2021

(86) PCT No.: PCT/CN2021/131357
§ 371 (c)(1),
(2) Date: Aug. 4, 2023

(87) PCT Pub. No.: WO2022/242070
PCT Pub. Date: Nov. 24, 2022

(65) Prior Publication Data

US 2024/0099079 A1 Mar. 21, 2024

(30) Foreign Application Priority Data

May 21, 2021 (CN) ........................ 202110558454.0

(51) Int. Cl.
*H10K 59/124* (2023.01)
*H10K 59/12* (2023.01)

(52) U.S. Cl.
CPC ....... *H10K 59/124* (2023.02); *H10K 59/1201* (2023.02)

(58) Field of Classification Search
CPC ......................... H10K 59/124; H10K 59/1201
(Continued)

(56) References Cited

U.S. PATENT DOCUMENTS 11,183,531 B2 11/2021 Jin
2007/0008421 A1 * 1/2007 Wu ....................... H10F 39/024 348/340
(Continued)

FOREIGN PATENT DOCUMENTS

CN 107195675 A 9/2017
CN 109524443 A 3/2019
(Continued)

OTHER PUBLICATIONS

International Search Report and Written Opinion mailed on Jan. 24, 2022, in corresponding PCT/CN2021/131357, 8 pages.
(Continued)

*Primary Examiner* — Eric W Jones
(74) *Attorney, Agent, or Firm* — XSENSUS LLP

(57) ABSTRACT

A display panel mainly comprises a substrate, a driving layer, a plurality of first electrodes, a light-emitting functional layer and a second electrode, wherein the substrate has a first pixel region and a second pixel region; the driving layer is arranged on one side of the substrate, and an orthographic projection thereof on the substrate covers the first pixel region and the second pixel region, and the driving layer located in the first pixel region is provided with recessed regions; the plurality of first electrodes are distributed in an array on the side of the driving layer that faces away from the substrate, both the first pixel region and the second pixel region are provided with the first electrodes, and the first electrodes and the recessed regions are distributed at intervals; the light-emitting functional layer covers
(Continued)

the first electrodes; and the second electrode covers the light-emitting functional layer.

20 Claims, 8 Drawing Sheets

(58) Field of Classification Search
USPC .................... 257/40, 59, 72, 88, 91, 99, 100
See application file for complete search history.

(56) References Cited

U.S. PATENT DOCUMENTS

| | | | | |
|---|---|---|---|---|
| 2011/0220908 | A1 | 9/2011 | Kim et al. | |
| 2018/0069060 | A1* | 3/2018 | Rappoport | H10K 59/60 |
| 2020/0020737 | A1 | 1/2020 | Jin | |
| 2020/0119304 | A1* | 4/2020 | Choi | H10K 59/8731 |
| 2020/0251545 | A1 | 8/2020 | Liu et al. | |
| 2020/0295300 | A1* | 9/2020 | Chung | H10K 59/124 |
| 2021/0210582 | A1* | 7/2021 | Lee | H10K 59/131 |
| 2021/0210725 | A1* | 7/2021 | Choi | H10K 59/122 |
| 2021/0384270 | A1 | 12/2021 | Liu et al. | |
| 2022/0415978 | A1* | 12/2022 | Huang | H10K 71/236 |

FOREIGN PATENT DOCUMENTS

| | | | |
|---|---|---|---|
| CN | 109817665 | A | 5/2019 |
| CN | 110232892 | A | 9/2019 |
| CN | 110323259 | A | 10/2019 |
| CN | 111599838 | A | 8/2020 |
| CN | 112490269 | A | 3/2021 |
| CN | 113299855 | A | 8/2021 |
| EP | 3584842 | A1 | 12/2019 |
| WO | 2020/228205 | A1 | 11/2020 |

OTHER PUBLICATIONS

Office Action issued on Aug. 3, 2022, in corresponding Chinese patent Application No. 202110558454.0, 21 pages.

Office Action issued on Mar. 9, 2023, in corresponding Chinese patent Application No. 202110558454.0, 18 pages.

* cited by examiner

DISPLAY PANEL WITH RECESSED AREAS, DISPLAY APPARATUS AND MANUFACTURING METHOD THEREFOR

CROSS-REFERENCE OF RELATED APPLICATIONS

The present disclosure is a National Stage of International Application No. PCT/CN2021/131357, filed on Nov. 18, 2021, which claims the priority of a Chinese patent application with application number 202110558454.0, filed on May 21, 2021, entitled "Display apparatus, and display panel and manufacturing method therefor", the entire contents of each are incorporated herein by reference in their entirety.

TECHNICAL FIELD

The present disclosure relates to the field of display technology, and in particular, to a display apparatus, a display panel and a manufacturing method therefor.

BACKGROUND

With the development of display technology, OLED (Organic Light-emitting Diode) display panel has been widely used in under display photography due to its advantages of thinness, lightness, high contrast, flexibility, and short response time. For example, a camera is disposed below the display panel. However, the transmittance of the area where the under display camera is located in the existing display panel is low, and the image acquisition performance is poor.

It should be noted that the information disclosed in the above Background section is only for enhancement of understanding of the background of the present disclosure, and therefore may contain information that does not form the prior art that is already known to those skilled in the art.

SUMMARY

The purpose of the present disclosure is to overcome the above-mentioned deficiencies of the prior art, and provide a display apparatus, a display panel and a manufacturing method therefor, which can increase the transmittance of the area where the camera is located, and improve the image acquisition performance of the camera.

According to an aspect of the present disclosure, there is provided a display panel, including: a substrate having a first pixel area and a second pixel area; a driving layer arranged on a side of the substrate, wherein an orthographic projection of the driving layer on the substrate covers the first pixel area and the second pixel area, and the driving layer located in the first pixel area is provided with a recessed area; a plurality of first electrodes, distributed in an array on a side of the driving layer away from the substrate, wherein the first pixel area and the second pixel area are both provided with the first electrodes, and the first electrodes is spaced apart from the recessed area; a light-emitting functional layer covering each of the first electrodes; a second electrode covering the light-emitting functional layer, wherein an orthographic projection of the second electrode on the driving layer covers at least a part of an area other than the first electrodes.

In an exemplary embodiment of the present disclosure, the recessed area includes a plurality of isolation holes distributed at intervals, and the isolation holes extend from a surface of the driving layer away from the substrate to the substrate.

In an exemplary embodiment of the present disclosure, the isolation holes have a depth of 0~3.5 um.

In an exemplary embodiment of the present disclosure, a thickness of the second electrode at a bottom of the isolation holes is smaller than a thickness of the second electrode at a surface of the light-emitting functional layer.

In an exemplary embodiment of the present disclosure, the orthographic projection of the second electrode on the substrate at most partially overlaps with an orthographic projection of an isolation hole on the substrate.

In an exemplary embodiment of the present disclosure, an angle between the substrate and a boundary of an orthographic projection of a sidewall of the isolation holes on a plane perpendicular to the substrate is 65°~125°.

In an exemplary embodiment of the present disclosure, the display panel further includes: a buffer layer located between the substrate and the driving layer; the driving layer includes a pixel driving circuit, and the pixel driving circuit includes a plurality of transistors distributed in an array, and the transistors include: an active layer located on a side of the substrate close to the first electrode; a first gate insulation layer covering the active layer; a first gate electrode, disposed on a side of the first gate insulation layer away from the substrate; a second gate insulation layer covering the first gate electrode and the first gate insulation layer; an interlayer dielectric layer covering the second gate electrode and the second gate insulation layer; a source-drain layer formed on a side of the interlayer dielectric layer away from the substrate, and including a source electrode and a drain electrode, wherein the source electrode and the drain electrode are respectively connected to both ends of the active layer; the isolation holes penetrate through the interlayer dielectric layer, the second gate insulation layer, the first gate insulation layer and the buffer layer.

In an exemplary embodiment of the present disclosure, the driving layer has a plurality of protrusions distributed at intervals on a side away from the substrate, and the protrusions are located in the first pixel area the recessed area is an area other than the protrusions and not covered by the first electrodes.

In an exemplary embodiment of the present disclosure, a thickness of the second electrode at a gap between two adjacent protrusions is smaller than a thickness of the second electrode at a surface of the light-emitting functional layer.

In an exemplary embodiment of the present disclosure, an orthographic projection of the second electrode on the substrate at most partially overlaps with an orthographic projection of a gap between two adjacent protrusions on the substrate.

In an exemplary embodiment of the present disclosure, an angle between the substrate and a boundary of an orthographic projection of a sidewall of the protrusions on a plane perpendicular to the substrate is 65°~90°.

In an exemplary embodiment of the present disclosure, the protrusions are transparent protrusions.

In an exemplary embodiment of the present disclosure, the display panel further includes: a planarization layer disposed on a surface of the driving layer away from the substrate; the protrusions are disposed on the same layer as the planarization layer, and a surface of a protrusion away from the driving layer protrudes from a surface of the planarization layer away from the driving layer.

In an exemplary embodiment of the present disclosure, a surface of the protrusion away from the driving layer is an arc surface.

In an exemplary embodiment of the present disclosure, each of the first electrodes is surrounded by a plurality of protrusions.

In an exemplary embodiment of the present disclosure, a number of the first electrodes located in the first pixel area per unit area is less than a number of the first electrodes located in the second pixel area per unit area.

In an exemplary embodiment of the present disclosure, the display panel further includes: an encapsulation layer located on a side of the second electrode and the recessed area away from the driving layer.

According to one aspect of the present disclosure, there is provided a method for manufacturing a display panel, including: providing a substrate having a first pixel area and a second pixel area; forming a driving layer on a side of the substrate, wherein an orthographic projection of the driving layer on the substrate covers the first pixel area and the second pixel area, and the driving layer located in the first pixel area is provided with a recessed area; forming a plurality of first electrodes distributed in an array on a side of the driving layer away from the substrate, wherein the first pixel area and the second pixel area are both provided with the first electrodes, and the first electrodes are spaced apart from the recessed area; forming a light-emitting functional layer covering each of the first electrodes; forming a second electrode covering the light-emitting functional layer, wherein an orthographic projection of the second electrode on the driving layer covers at least a part of an area other than the first electrodes.

In an exemplary embodiment of the present disclosure, the recessed area includes a plurality of isolation holes distributed at intervals, and the isolation holes extend from the surface of the driving layer away from the substrate to the substrate.

In an exemplary embodiment of the present disclosure, the driving layer has a plurality of protrusions distributed at intervals on a side away from the substrate, the protrusions are located in the first pixel area, and the recessed area is an area other than the protrusions and not covered by the first electrodes.

In an exemplary embodiment of the present disclosure, the manufacturing method further includes: baking surfaces of the protrusions at a preset temperature, so that the surfaces of the protrusion away from the driving layer is curved.

In an exemplary embodiment of the present disclosure, the preset temperature is 60° C.~100° C.

According to one aspect of the present disclosure, a display device is provided, including the display panel described in any one of the above.

In the display device, display panel and manufacturing method of the present disclosure, a plurality of light-emitting units can be respectively formed in the first pixel area and the second pixel area by a plurality of first electrodes, a light-emitting functional layer, and a second electrode, thereby achieving display in both the first pixel area and the second pixel area. Meanwhile, in the process of forming the second electrode, the material of the second electrode can be blocked by the sidewall of the recessed area, reducing the thickness of the second electrode deposited to the bottom of the recessed area, and avoiding influence on the transmittance of the recessed area due to the low transmittance of the second electrode, thereby increasing the transmittance of the recessed area. In this process, since the recessed area is located in the first pixel area, the transmittance of the first pixel area can be improved, and the camera is arranged below the first pixel area, which can ensure that more light enters the camera, thereby improving the image acquisition performance of the camera.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Obviously, the drawings in the following description are only some embodiments of the present disclosure, and for those ordinary skilled in the art, other drawings can also be obtained from these drawings without inventive labor.

EXPLANATION OF REFERENCE NUMBERS

Figure 1:
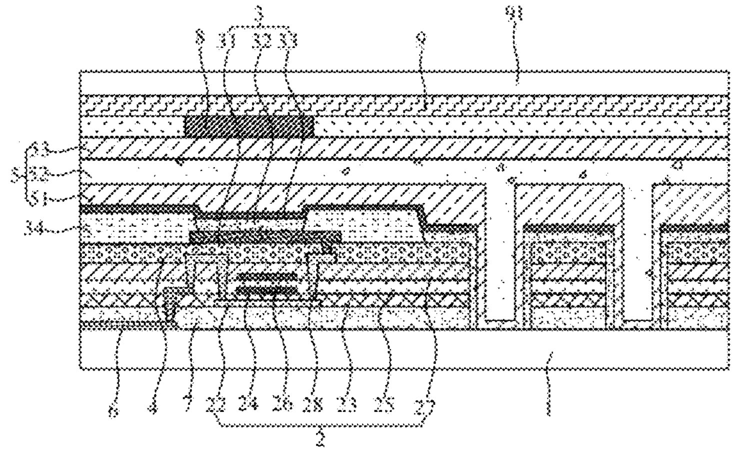
FIG. 1 is a schematic diagram of a display panel in a first embodiment of the present disclosure.

1, Substrate; 101, First pixel area; 102, Second pixel area; 2, Driving layer; 211, Isolation hole; 212, Protrusion; 22, Active layer; 23, First gate insulation layer; 24, First gate electrode; 25, Second gate insulation layer; 26, Second gate; 27, interlayer dielectric layer; 28, Source-drain layer; 3, Light-emitting unit; 31, First electrode; 32, Light-emitting functional layer; 33, Second electrode; 34, Pixel definition layer; 4, Planarization layer; 5, Encapsulation layer; 51, First inorganic layer; 52, Organic layer; 53, Second inorganic layer; 6, Lead wire; 7, Buffer layer; 8, Color filter layer; 9. Protective layer; 91, Covering layer.

DETAILED DESCRIPTION

Exemplary embodiments will now be described more fully with reference to the accompanying drawings. Exemplary embodiments, however, can be embodied in various forms and should not be construed as limited to the embodiments set forth herein; rather, these embodiments are provided so that this disclosure will be thorough and complete, and will fully convey the concept of exemplary embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

Although relative terms such as "top" and "bottom" are used in this specification to describe the relative relationship of one component of an icon to another component, these terms are used in this specification only for convenience, such as according to the direction of the example described in the drawing. It will be appreciated that if the device of the icon is turned upside down, the components described as on "top" will become the components on "bottom". When a certain structure is on "top" of other structure, it may mean that a certain structure is integrally formed on top of other structure, or that a certain structure is "directly" arranged on top of other structure, or that a certain structure is "indirectly" arranged on top of other structure through another structure.

The terms "a". "an". "the", "said" and "at least one" are used to indicate the presence of one or more elements/components/etc.; the terms "include" and "have" are used to indicate open inclusion and means that additional elements/components/etc. may be present in addition to the listed elements/components/etc.; the terms "first", "second" and "third" etc. are only used as a marker, and are not limitations on the number of objects thereof.

With the development of full screens, electronic devices have higher and higher requirements for screen-to-body ratio. However, due to its functional requirements, usually, a front camera and a sensor need to be arranged under the display screen, rendering that the screen ratio of the electronic device cannot reach 100%. In related art, in order to increase the screen ratio, a part of the display area is usually set as a translucent display area, and the camera is placed under the translucent display area, that is, UDC (Under Display Camera). However, due to the low transmittance of the second electrode of the light-emitting unit in the translucent display area (usually lower than 60%), the overall transmittance of the translucent display area is low, and the image acquisition performance is poor due to insufficient light in the process of capturing images by the camera.

Figure 2:
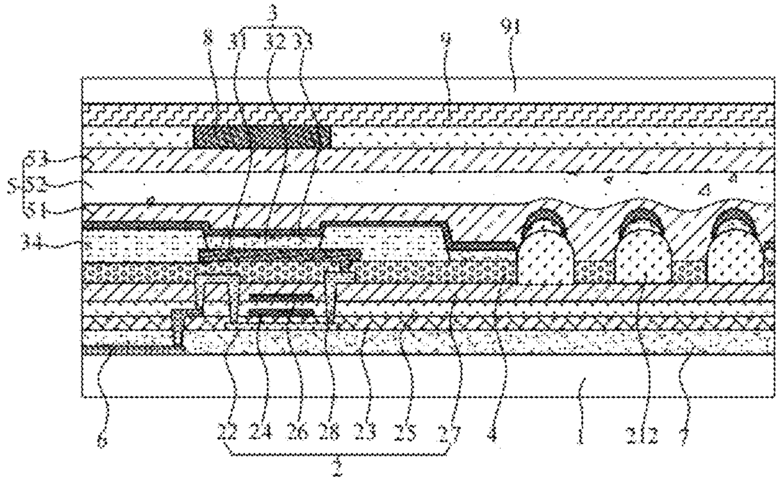
FIG. 2 is a schematic diagram of a display panel in a second embodiment of the present disclosure.

Embodiments of the present disclosure provide a display panel, and the display panel may be an OLED display panel, and of course, may also be other display panels, which are not specifically limited herein. FIG. 1 and FIG. 2 show schematic diagrams of a display panel in an embodiment of the present disclosure. As can be seen from FIG. 1 and FIG. 2, the display panel can include a substrate 1, a driving layer 2, a plurality of first electrodes 31, a light-emitting functional layer 32 and a second electrode 33, wherein:

The substrate 1 has a first pixel area and a second pixel area;

The driving layer 2 is arranged on a side of the substrate 1, and its orthographic projection on the substrate 1 covers the first pixel area and the second pixel area, and the driving layer 2 located in the first pixel area is provided with a recessed area;

A plurality of first electrodes 31 are distributed in an array on the surface of the driving layer 2 away from the substrate 1, and both the first pixel area and the second pixel area are provided with first electrodes 31, and the first electrodes 31 are spaced apart from the recessed area;

The light-emitting functional layer 32 covers each first electrode 31;

The second electrode 33 covers the light-emitting functional layer 32, and the orthographic projection of the second electrode 33 on the driving layer 2 covers at least a part of the area beyond the first electrode 31.

In the display panel of the embodiment of the present disclosure, a plurality of light-emitting units 3 can be formed in the first pixel area and the second pixel area by a plurality of first electrodes 31, a light-emitting functional layer 32 and a second electrode 33, respectively, thereby displaying both in the first pixel area and the second pixel area. Meanwhile, in the process of forming the second electrode 33, the material of the second electrode 33 can be shielded by the sidewall of the recessed area, which reduces the thickness of the second electrode 33 deposited on the bottom of the recessed area, and avoids affecting the transmittance of the recessed area due to the low transmittance of the second electrode 33, thereby increasing the transmittance of the recessed area. In this process, since the recessed area is located in the first pixel area, the transmittance of the first pixel area can be improved. The camera is arranged under the first pixel area, which can ensure that more light enters the camera, thereby improving the image acquisition performance.

FIG. 1 and FIG. 2 show the structural schematic diagrams of the display panel in the embodiment of the present disclosure. The light-emitting principle of the display panel in the embodiment of the present disclosure will be described below with reference to FIG. 1 and FIG. 2:

The display panel mainly includes a substrate 1, a driving layer 2 and a light-emitting device layer, wherein the driving layer 2 can be arranged on a side of the substrate 1, which can include a plurality of pixel driving circuits arranged side by side. The light-emitting device layer is arranged on a side of the driving layer 2 away from the substrate 1, and includes a plurality of light-emitting units 3 distributed in an array. Different light-emitting units 3 can be connected to different pixel driving circuits, and each light-emitting unit 3 can be powered through each pixel driving circuit, and then image is displayed. It should be noted that, in one embodiment of the present disclosure, the pixel driving circuit can be connected to an external circuit through the lead wire 6, and then power is provided to the pixel driving circuit through the external circuit.

In an exemplary embodiment of the present disclosure, the substrate 1 may be a flat plate structure, which may be made of hard material such as glass, or flexible material such as PI (polyimide). The substrate 1 can be a transparent substrate, and it can be a single-layer or multi-layer structure, which is not particularly limited here. When the substrate 1 is a multi-layer structure, the transmittance of each layer is at least higher than 76%, for example, the transmittances of some film layers in the substrate 1 may be 76%, 90%, 98% or 99%.

Figure 3:
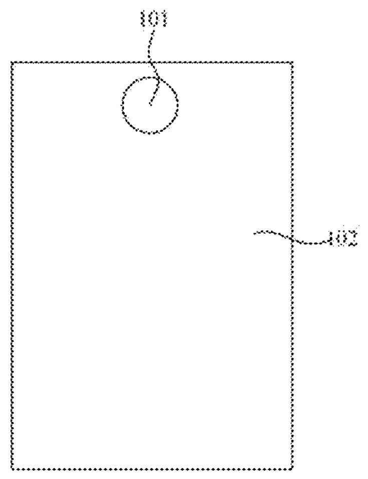
FIG. 3 is a top view of a display panel in an embodiment of the disclosure.

In an exemplary embodiment of the present disclosure, the substrate 1 has a pixel area. As shown in FIG. 3, pixel area may include a first pixel area 101 and a second pixel area 102, which may be arranged side by side and adjacently. The first pixel area 101 may be a circular area, an elliptical area, a rectangular area or an area of other shapes, which are not specifically limited herein. The orthographic projection of the driving layer 2 on the substrate 1 can cover the first pixel area 101 and the second pixel area 102, and at the same time, the orthographic projection of the light-emitting device layer on the substrate 1 can also cover the first pixel area 101 and the second pixel area 102.

In an exemplary embodiment of the present disclosure, both the first pixel area 101 and the second pixel area 102 can be provided with a plurality of light-emitting units 3, so that images can be displayed on both the first pixel area 101 and the second pixel area 102. The pixel driving circuit connected to the light-emitting unit 3 of the first pixel area 101 can be at least partly disposed in the second pixel area 102, so as to prevent the pixel driving circuit from blocking the light of the first pixel area 101 and improve the transmittance of the first pixel area 101. Of course, each pixel driving circuit connected to the light-emitting units 3 of the first pixel area 101 may also be disposed under each light-emitting unit 3 in a one-to-one correspondence, and there is no special limitation here.

In an exemplary embodiment of the present disclosure, the distribution density of the light-emitting units 3 located in the first pixel area 101 may be smaller than the distribution density of the light-emitting units 3 located in the second pixel area 102, that is, the number of the light-emitting units 3 located in the first pixel area per unit area is less than the number of light-emitting units 3 in the second pixel area 102 per unit area. A recessed area can be formed in the driving layer 2 located in the first pixel area 101, and then the transmittance of the first pixel area 101 can be improved through the setting of the recessed area. The camera can be disposed under the first pixel area 101, thereby ensuring more light enters the camera to improve the image acquisition performance of the camera.

It should be noted that the shape of the first pixel area 101 can match the shape of the lens of the camera, and its size can match the size of the lens of the camera. For example, when the lens of the camera is circular, the first pixel area 101 can be a circular area, and its diameter can be equal to the diameter of the lens of the camera. At this time, the second pixel area 102 can surround the periphery of the first pixel area 101.

In an exemplary embodiment of the present disclosure, the light-emitting unit 3 may be a transparent light-emitting unit, which may include a first electrode 31, a light-emitting functional layer 32, and a second electrode 33, wherein:

The first electrode 31 can be arranged on the side of the driving layer 2 away from the substrate 1 and can be connected to the pixel driving circuit. The first electrode 31 can be used as an anode layer of the light-emitting unit 3 and its material can be a transparent conductive material. For example, it can be ITO or AZO.

The light-emitting functional layer 32 can cover the first electrode 31, that is, it can be arranged on the surface of the first electrode 31 away from the driving layer 2, and can provide a recombination site for excitons to emit light. The light-emitting functional layer 32 can be a single-layer film layer, or it can be a multi-layer film layer, and there is no special limitation here; taking a multi-layer film layer as an example, it can include a hole injection layer, a hole transport layer, an electron blocking layer, a light-emitting layer, and a hole blocking layer, an electron transport layer and an electron injection layer that are sequentially stacked and distributed, wherein the hole injection layer may be formed on the surface of the first electrode 31. The thickness of the light-emitting functional layer 32 may be 300 nm, and it may be made of a transparent material, and the transmittance of the transparent material may be 98%.

The second electrode 33 can cover the light-emitting functional layer 32, and its orthographic projection on the driving layer 2 can cover at least a part of the area beyond the first electrode 31. The second electrode 33 may be a metal oxide electrode, a metal electrode, a metal alloy electrode or a composite electrode formed by combining metal and metal oxide, which is not specifically limited herein. The second electrode 33 can be made of transparent or translucent conductive material, and its light transmittance can be 51%. The second electrode 33 can be used as a cathode layer of the light-emitting unit 3, and a voltage can be applied to the first electrode 31 and the second electrode 33 to make the light-emitting functional layer 32 emit light.

Figure 4:
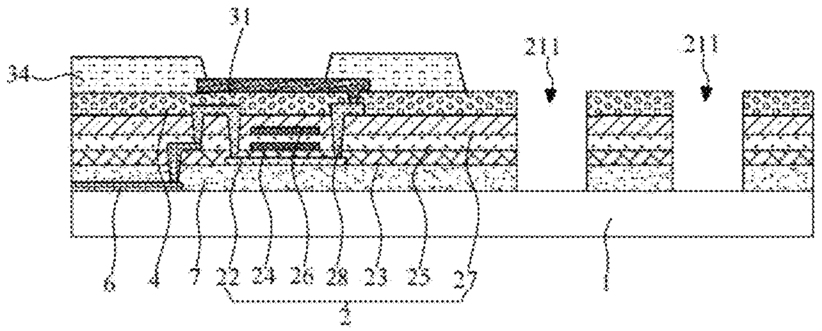
FIG. 4 is a schematic diagram of the driving layer in the first embodiment of the present disclosure.
Figure 5:
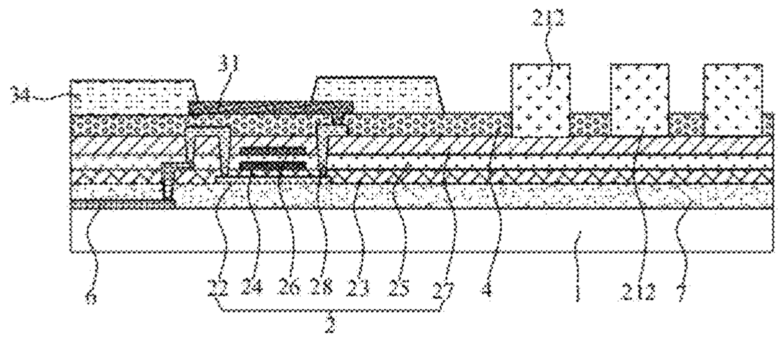
FIG. 5 is a schematic diagram of a driving layer in a second embodiment of the present disclosure.

As shown in FIG. 4 and FIG. 5, the pixel driving circuit may include transistors, and the transistors may be connected to the first electrodes 31 of the light-emitting units 3 so as to control each light-emitting unit 3 to emit light through each transistor correspondingly, thereby displaying images.

The transistor may include an active layer 22, a gate insulation layer, a gate electrode, an interlayer dielectric layer 27, and a source-drain layer 28. The gate insulation layer may include a first gate insulation layer 23 and a second gate insulation layer 25. The gate electrode may include a first gate 24 and a second gate 26. The active layer 22 may be formed by doping the active area multiple times, and the active layer 22 can be located on the side of the substrate 1 close to the light-emitting device layer. The first gate insulation layer 23 covers the active layer 22. The first gate electrode 24 is arranged on the side of the first gate insulation layer 23 away from the substrate 1. The second gate insulation layer 25 covers the first gate electrode 24 and the first gate insulation layer 23. The interlayer dielectric layer 27 covers the second gate electrode 26 and the second gate insulation layer 25, and the first gate insulation layer 23, the second gate insulation laver 25 and the interlayer dielectric layer 27 can be perforated to form a via hole for connecting active layer 22. The orthographic projection of the via hole on the substrate 1 and the orthographic projection of the gate electrode on the substrate 1 do not overlap with each other. The source-drain layer 28 is formed on the side of the interlayer dielectric layer 27 away from the substrate 1, and includes a source electrode and a drain electrode. The source electrode and the drain electrode can be connected to both ends of the active layer 22 through via holes penetrating through the first gate insulation layer 23, the second gate insulation layer 25 and the interlayer dielectric layer 27. For example, the transistor may be a dual-gate field effect transistor, and of course, it may also be other types of transistors, which are not specifically limited herein.

In an exemplary embodiment of the present disclosure, when each light-emitting unit 3 is formed, a plurality of first electrodes 31 distributed in an array can be formed on the side of the driving layer 2 away from the substrate 1. Specifically, a plurality of the first electrodes 31 arranged in an array can be disposed in both the pixel area 101 and the second pixel area 102, and each first electrode 31 located in the first pixel area 101 can be spaced apart from the recessed area. During this process, in order to leave enough space for the recessed area, the distribution density of the first electrodes 31 located in the first pixel area 101 can be smaller than the distribution density of the first electrodes 31 located in the second pixel area 102 (that is, the number of first electrodes 31 located in the first pixel area 101 per unit area can be less than the number of first electrodes 31 located in the second pixel area 102 per unit area). A recessed area can be formed on the periphery of the first electrodes 31 located in the first pixel area 101.

In order to define the range of each light-emitting unit 3 in the light-emitting functional layer 32, the display panel of the present disclosure further includes a pixel definition layer 34, as shown in FIG. 4 and FIG. 5, which can be located on the side of the driving layer 2 away from the substrate 1, and can be disposed on the same side of the driving layer 2 as the first electrodes 31. The pixel definition layer 34 may be provided with a plurality of first openings and a second opening spaced apart from the first openings. Each of the first openings may expose a first electrode 31, and the second opening may expose a recessed area.

Figure 6:
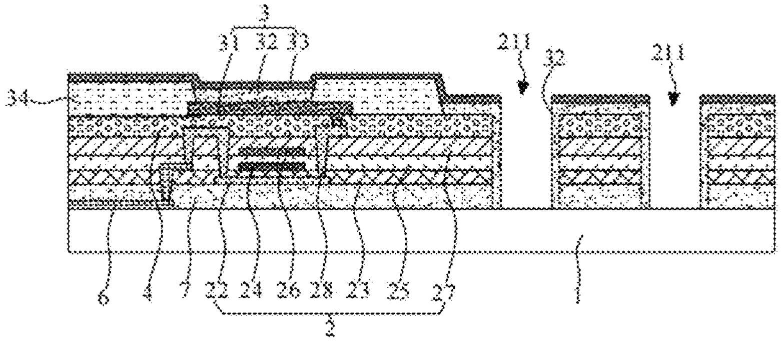
FIG. 6 is a schematic diagram of the driving layer in the first embodiment of the present disclosure.
Figure 7:
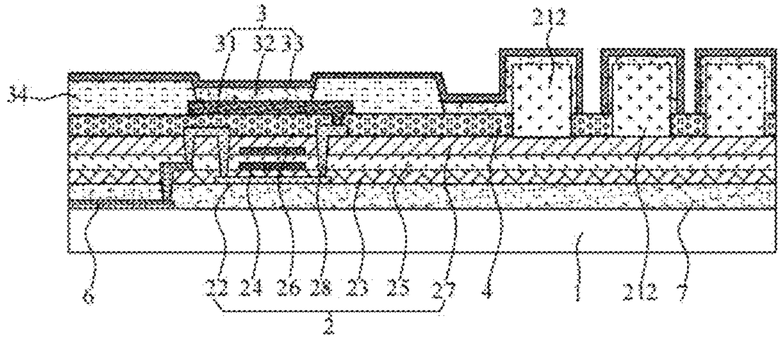
FIG. 7 is a schematic diagram of a driving layer in a second embodiment of the present disclosure.

As shown in FIG. 6 and FIG. 7, the light-emitting functional layer 32 can be formed on the surface of the first electrode 31 away from the driving layer 2, and can at least cover the inside of the first opening. For example, vacuum evaporation, magnetron sputtering, chemical vapor deposition or physical vapor deposition can be used to form the light-emitting functional layer 32 on the surface of the first electrode 31.

As shown in FIG. 6 and FIG. 7, the second electrode 33 covering the light-emitting functional layer 32 can be formed, and the orthographic projection of the second electrode 33 on the driving layer 2 can cover at least part of the area beyond the first electrode 31. For example, the second electrode 33 can be formed on the surface of the first electrode 31 by vacuum evaporation, magnetron sputtering, chemical vapor deposition or physical vapor deposition. Each light-emitting unit 3 can share the second electrode 33, and the second electrode 33 of each light-emitting unit 3 can be formed simultaneously by one process. In order to reduce production costs, an open mask can be used for masking. During this process, the material of the second electrode 33 can be blocked by the sidewall of the recessed area, which reduces the thickness of second electrode 33 deposited on the bottom of the recessed area, and avoids affecting the transmittance of the recessed area due to the low transmittance of the second electrode 33, thereby increasing the transmittance of the recessed area. At the same time, the depth and slope angle of the recessed area can also be reasonably set so that the material of the second electrode 33 is disconnected at the sidewall of the recessed area, so as to avoid the deposition of the material of the second electrode 33 to the bottom of the recessed area and further improve the transmittance of the recessed area. In this process, since the recessed area is located in the first pixel area 101, the transmittance of the first pixel area 101 can be improved, and the camera is arranged under the first pixel area 101, which can ensure that more light enters the camera, thereby improving the image acquisition performance of the camera.

The structure and specific details of the recessed area are described in detail below through various embodiments:

In the first embodiment of the present disclosure, as shown in FIG. 4 and FIG. 6, the recessed area may include a plurality of isolation holes 211 distributed at intervals, and each isolation holes 211 may extend from the surface of the driving layer 2 away from the substrate 1 to the substrate 1, and its depth can be 0-3.5 um, for example, it can be 0.5 um, 1.0 um, 1.5 um, 2.0 um, 2.5 um, 3.0 um or 3.5 um, of course, it can also be other depths, which are not listed all here. In one embodiment, the isolation holes 211 can penetrate a part of the film layers of the driving layer 2, or can penetrate all the film layers of the driving layer 2, or can penetrate through all the film layers of the driving layer 2 while also penetrating other film layers between the driving layer 2 and the substrate 1 and exposing the substrate 1. There is no special limitation on the specific film layers through which the isolation holes 211 penetrates. For example, the isolation holes 211 can penetrate through the interlayer dielectric layer 27, the second gate insulation layer 25 and the first gate insulation layer 23.

In some embodiments of the present disclosure, the isolation holes 211 can be a straight hole, and its sidewall can be perpendicular to the substrate 1. In a direction parallel to the substrate 1, the cross section of the isolation holes 211 can be circular, rectangular, polygonal or irregular graphics, and there is no special limitation here. In other embodiments of the present disclosure, the isolation holes 211 can shrink from the side of the driving layer 2 away from the substrate 1 toward the side of the driving layer 2 close to the substrate 1, or can extend from the side of the driving layer 2 away from the substrate 1 toward the side of the driving layer 2 close to the substrate 1, which is not specifically limited here.

For example, the angle between the substrate 1 and the boundary of the orthographic projection of the sidewall of the isolation holes 211 on a plane perpendicular to the substrate 1 may be 65° ~125° (that is, the slope angle of the isolation hole 211 may be 65°~125°). For example, the slope angle of the isolation hole 211 can be 65°, 75°, 85°, 95°, 105°, 115° or 125°. Of course, the slope angle can also be other angles, which will not be listed one by one here.

Figure 8:
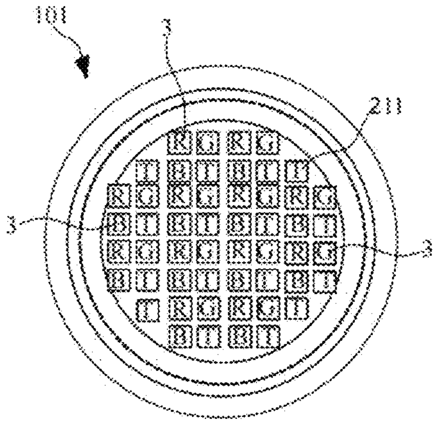
FIG. 8 is a schematic diagram of a first pixel area in the first embodiment of the present disclosure.

As shown in FIG. 8, each isolation holes 211 can be evenly distributed in the first pixel area 101, and can be spaced apart from the first electrode 31 of the first pixel area 101, and can form a light-emitting functional layer 32 and a second electrode 33 respectively on the surface of each first electrode 31, thereby forming a plurality of light-emitting units 3 in the first pixel area 101. The colors of light emitted by the light-emitting functional layers 33 in different light-emitting units 3 may be same or different, which are not particularly limited here. In one embodiment, the plurality of light-emitting units 3 can emit light of at least three colors, which can be red (R), green (G) and blue (B) respectively, and RGB can be evenly distributed to achieve full color show. For example, isolation holes 211 can form a plurality of annular rings, and each annular ring can be regarded as a group, and each first electrode 31 can be surrounded by a group of isolation holes 211.

The second electrode 33 can be formed by an evaporation process. During the process of evaporating the second electrode 33, the material of the second electrode 33 can be blocked by the hole wall of the isolation holes 211, so that the thickness of the second electrode 33 deposited on the bottom of the isolation holes 211 is smaller than the thickness of the second electrode on the surface of the light-emitting functional layer 32, thereby reducing the influence of the material of the second electrode 33 on the transmittance, so that the transmittance at the bottom of the isolation holes 211 is increased.

Further, the material of the second electrode 33 can be disconnected along the wall of the isolation holes 211 during the evaporation process by controlling the depth of the isolation holes 211, so as to prevent the material of the second electrode 33 from being deposited to the bottom of the isolation holes 211 and avoid the influence of the material of the second electrode 33 on the transmittance of the area where the isolation holes 211 is located, thereby increasing the transmittance at the bottom of the isolation holes 211, that is: the orthographic projection of the second electrode 33 on the substrate 1 may at most partially overlap with the orthographic projection of the isolation holes 211 on the substrate.

For example, the depth and width of the isolation holes 211 can be set according to the evaporation width of the evaporation device and the distance between the evaporation device and the surface of the substrate 1, so as to ensure that the material of the second electrode 33 can break at the hole wall of the isolation holes 211 during evaporation without depositing to the bottom thereof. For example, when the evaporation width of the evaporation device, the distance between the evaporation device and the surface of the substrate 1, and the depth and width of the isolation holes 211 meet Formula I, it can be ensured that the material of the second electrode 33 breaks at the hole wall of the isolation holes 211 during evaporation without depositing to the bottom thereof.

$$L/d=D/Ts \qquad \text{Formula I.}$$

Wherein, L is the width of the isolation holes 211, d is the depth of the isolation holes 211, D is the distance from the evaporation source of the evaporation device to the evaporation center, and Ts is the distance between the evaporation source and the surface of the substrate 1.

Figure 9:
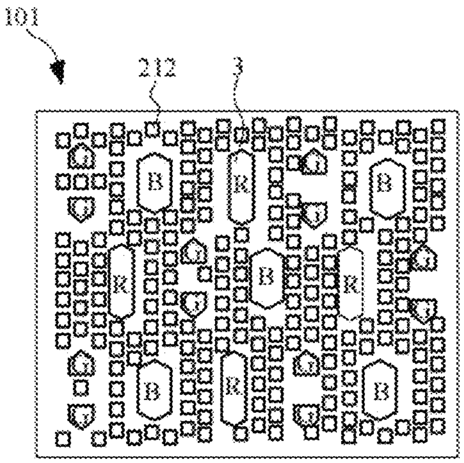
FIG. 9 is a schematic diagram of a first pixel area in a second implementation manner of the present disclosure.

In the second embodiment of the present disclosure, as shown in FIG. 9, the driving layer 2 has a plurality of protrusions 212 distributed at intervals on the side away from the substrate 1, and each protrusion 212 can be located in the first pixel area 101, the recessed area may be an area outside each protrusion 212 and not covered by the first electrode 31. The protrusions 212 can be spaced apart from the first electrodes 31 of the first pixel area 101, and a light-emitting functional layer 32 and a second electrode 33 can be formed on the surface of the first electrodes 31 respectively, thereby forming a plurality of the light-emitting units 3 in the first pixel area 101. The colors of light emitted by the light-emitting functional layer 33 in different light-emitting units 3 may be same or different, and there is no special limitation here. In one embodiment, the plurality of light-emitting units 3 can emit light of at least three colors, which can be red (R), green (G) and blue (B) respectively, and RGB can be evenly distributed to achieve full color show.

In an exemplary embodiment of the present disclosure, the protrusions 212 may be a protrusion structure formed on the surface of the driving layer 2. In order to improve the light transmittance of the area where the protrusions 212 are located, each protrusion 212 may be a transparent protrusion 212, which can be made of transparent material. For example, the material can be transparent resin. Of course, the protrusion 212 can also be made of other transparent materials, which is not specifically limited here.

The display panel of the present disclosure may further include a planarization layer 4. The planarization layer 4 may be disposed on the surface of the driving layer 2 away from the substrate 1, and the light-emitting device layer may be formed on the surface of the planarization layer 4 away from the driving layer 2. For example, the planarization layer 4 can cover the source-drain layer 28 and the interlayer dielectric layer 27 to eliminate device gaps in the source-drain layer 28. The first electrode 31 of the light-emitting unit 3 can pass through the planarization layer 4 and be connected to the source-drain layer 28. The protrusion 212 can be formed on the surface of the driving layer 2 and can be disposed on the same layer as the planarization layer 4, and the surface of the protrusion 212 away from the driving layer 2 can protrude from the surface of the planarization layer 4 away from the driving layer 2.

In an exemplary embodiment of the present disclosure, the protrusion 212 may be disposed on the surface of the substrate 1, and may extend from the surface of the substrate 1 to a side away from the substrate 1. The protrusion 212 can penetrate the driving layer 2 and protrude from the surface of the driving layer 2 away from the substrate 1, so that a recessed area can be formed on the surface of the driving layer 2 outside the protrusion 212 and not covered by the first electrode 31.

In some embodiments of the present disclosure, the protrusion 212 may extend along a direction perpendicular to the substrate 1, and its sidewall may be perpendicular to the substrate 1. In a direction parallel to the substrate 1, the cross-section of the protrusion 212 can be circular, rectangular, polygonal or irregular, and there is no special limitation here. In some other embodiments of the present disclosure, the sidewall of the protrusion 212 may shrink from the side of the driving layer 2 away from the substrate 1 to the side close to the substrate 1, or may expand from the side of the driving layer 2 away from the substrate 1 to the side close to the substrate 1, and there is no special limitation here.

For example, the angle between the substrate 1 and the boundary of the orthographic projection of the sidewall of the protrusion 212 on the plane perpendicular to the substrate 1 may be 65° ~90° (that is, the slope angle of the protrusion 212 may be 65° ~90°) For example, the slope angle of the protrusion 212 can be 65°, 70°, 75° 80°, 85° or 90°. Of course, the slope angle can also be other angles, and we will not list them one by one here.

Each protrusion 212 can be evenly distributed in the first pixel area 101 and can be spaced apart from the first electrode 31 in the first pixel area 101. For example, the protrusions 212 can form a plurality of annular rings, and each annular ring can be regarded as a group, and each first electrode 31 can be surrounded by a group of protrusions 212.

The second electrode 33 can be formed by an evaporation process. During the process of evaporating the second electrode 33, the material of the second electrode 33 can be blocked by the side walls of the protrusions 212, so that the thickness of the second electrode 33 deposited on the gap between two adjacent protrusions 212 is smaller than the thickness of the second electrode 33 on the surface of the light-emitting functional layer 32, thereby reducing the influence of the material of the second electrode 33 on the transmittance, so that the transmittance at the gap between the protrusions 212 increases.

Further, by controlling the height of the protrusion 212 and the distance between two adjacent protrusions 212, the material of the second electrode 33 is disconnected along the sidewall of the protrusion 212 during the evaporation process, preventing the material of the second electrode 33 from deposited to the gap between two adjacent protrusions 212, avoiding the influence of the material of the second electrode 33 on the transmittance at the gap between two adjacent protrusions 212, thereby improving the transmittance of the gap between two adjacent protrusions 212, that is, the orthographic projection of the second electrode 33 on the substrate 1 may at most partially overlap with the orthographic projection of the gap between two adjacent protrusions 212 on the substrate 1.

For example, the height of the protrusion 212 and the distance between two adjacent protrusions 212 can be set according to the evaporation width of the evaporation device, and the distance between the evaporation device and the surface of the substrate 1, so as to ensure that the material of the second electrode 33 can break at the sidewalls of the protrusions 212 during evaporation, and will not be deposited in the gap between two adjacent protrusions 212. For example, when the evaporation width of the evaporation device, the distance between the evaporation device and the surface of the substrate 1, the height of the protrusion 212, and the distance between two adjacent protrusions 212 meet formula II, it can be ensured that the material of the second electrode 33 breaks at the sidewall of the protrusion 212 during evaporation, but not deposited to the bottom thereof.

$$L/H=D/Ts \quad \text{Formula II,}$$

Wherein, L is the distance between two adjacent protrusions 212, H is the height of the protrusion 212, D is the distance from the evaporation source of the evaporation device to the evaporation center, and Ts is the distance between the evaporation source and the surface of the substrate 1.

Figure 10:
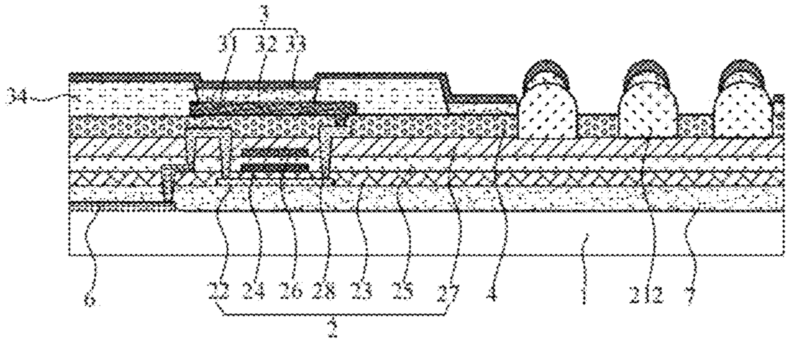
FIG. 10 is a schematic diagram of a protrusion in a second embodiment of the present disclosure.
Figure 11:
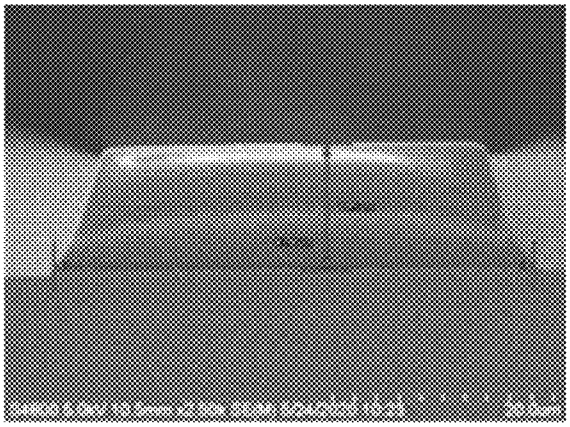
FIG. 11 is a surface topography diagram of the protrusions before baking in the second embodiment of the present disclosure.
Figure 12:
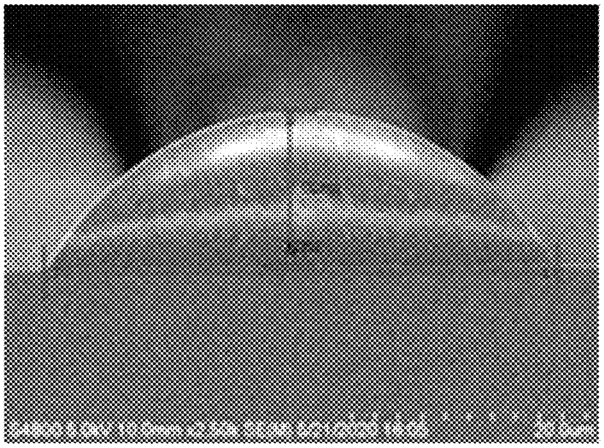
FIG. 12 is a surface topography diagram of the protrusion after baking in the second embodiment of the present disclosure.

The surface of the protrusion 212 away from the driving layer 2 may be curved. For example, as shown in FIG. 10, the surface of the protrusion 212 away from the substrate 1 can be baked at a preset temperature to make the surface of the protrusion 212 away from the driving layer 2 curved, which can protrude in the direction away from the substrate 1, that is, the protrusion 212 can be in the form of a lens, which helps to improve the forward transmittance of light. The morphology of the protrusion 212 before and after baking is shown in FIG. 1l and FIG. 12.

In one embodiment, the preset temperature can be 60° C. to 100° C. For example, it can be 60° C., 70° C. 80° C., 90° C. or 100° C. Of course, it can also be other temperatures, which are not listed one by one here.

In an exemplary embodiment of the present disclosure, the display panel of the present disclosure may further include a buffer layer 7, which may be located between the substrate 1 and the driving layer 2. For example, the buffer layer 7 may be formed on surface of the substrate 1, and the driving layer 2 may be located on the surface of buffer layer 7 away from the substrate 1. The buffer layer 7 can be formed on the surface of the substrate 1 by chemical vapor deposition, physical vapor deposition or atomic layer deposition, and the buffer layer 7 can prevent impurities in the substrate 1 from diffusing into the driving layer 2 and protect the stability of the driving layer 2.

It should be noted that when the recessed area is the isolation holes 211, the isolation holes 211 may penetrate the interlayer dielectric layer 27, the second gate insulation layer 25, the first gate insulation layer 23 and the buffer layer 7 and expose the substrate 1.

Figure 13:
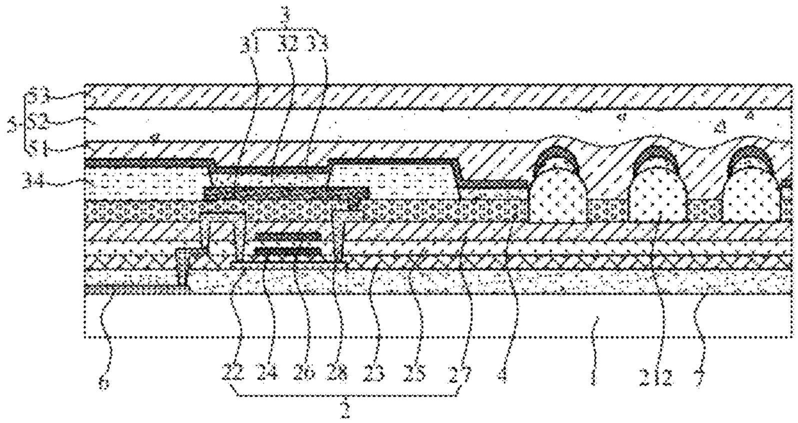
FIG. 13 is a schematic diagram of the encapsulation layer in the first embodiment of the present disclosure.
Figure 14:
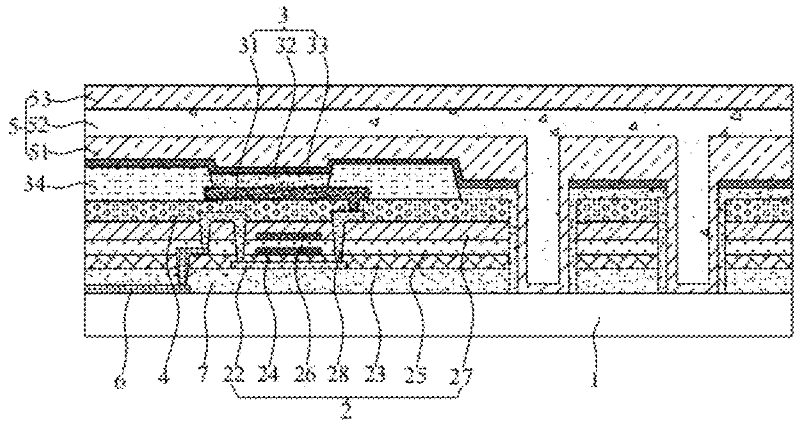
FIG. 14 is a schematic diagram of the encapsulation layer in the second embodiment of the present disclosure.

In an exemplary embodiment of the present disclosure, as shown in FIG. 13 and FIG. 14, the display panel of the present disclosure can further include an encapsulation layer 5, which can be used to block external water and oxygen, and prevent the light-emitting device layer from being corroded by external water and oxygen, thereby prolonging the service life of the device. For example, the encapsulation layer 5 can be located on the side of the second electrode 33 and the recessed area away from the driving layer 2, which can cover the second electrode 33 and fill up the recessed area at the same time. When the recessed area is an area other than the protrusions 212 and not covered by the first electrode 31, since the surface of the protrusion 212 is an arc surface protruding away from the substrate 1, the slope angle of each area of the surface is relatively small. The slope change is relatively gentle without obvious corners, which can make the encapsulation layer 5 better cooperate with the arc surface, thereby reducing the risk of peeling off the encapsulation layer 5, thereby reducing the risk of failure of the encapsulation layer 5.

The encapsulation layer 5 can be made of organic materials or inorganic materials, and can also be a composite film layer in which organic layers 52 and inorganic layers alternate. For example, the material of the encapsulation layer 5 can be acrylic material, or the composite film layer composed of materials such as silicon nitride, silicon oxide or silicon oxynitride, which is not particularly limited here.

In one embodiment, the encapsulation layer 5 may be a composite film structure in which organic layers 52 and inorganic layers alternate. For example, it may include a first inorganic layer 51, an organic layer 52 and a second inorganic layer 53. The first inorganic layer 51 can be formed on the surface of the light-emitting device layer. The second inorganic layer 53 is formed on the side of the first inorganic layer 51 away from the light-emitting device layer. The organic layer 52 is located between the first inorganic layer 51 and the second inorganic layer 53. Water and oxygen can be blocked by the inorganic layers, the stress of the inorganic layer is released through the organic layer 52, thereby preventing the peeling between the light-emitting device layer and the first inorganic layer 51 due to tension caused by stress.

In an exemplary embodiment of the present disclosure, the display panel of the present disclosure may further include a color film layer, which may be located on the surface of the encapsulation layer 5 away from the substrate 1, and may include a color filter layer 8 and a protective layer 9. The color filter layer 8 can include a plurality of color filters arranged at intervals, and adjacent color filters are separated by a black matrix; a plurality of color filters can include R (red), G (green), B (blue) filter, etc., each color filter corresponds to a light-emitting unit 3, and the light entering each light-emitting unit 3 can be filtered through the color filter to prevent stray light from entering the light-emitting unit 3 and improve display effect. The protection layer 9 can cover the color filter and the black matrix to protect the color filter and the black matrix. A covering layer 91 may also be formed on the surface of the protective layer 9 away from the substrate 1, and the surface of the protective layer 9 can be further protected by the covering layer 91 to prevent the surface of the display panel from being scratched.

Figure 15:
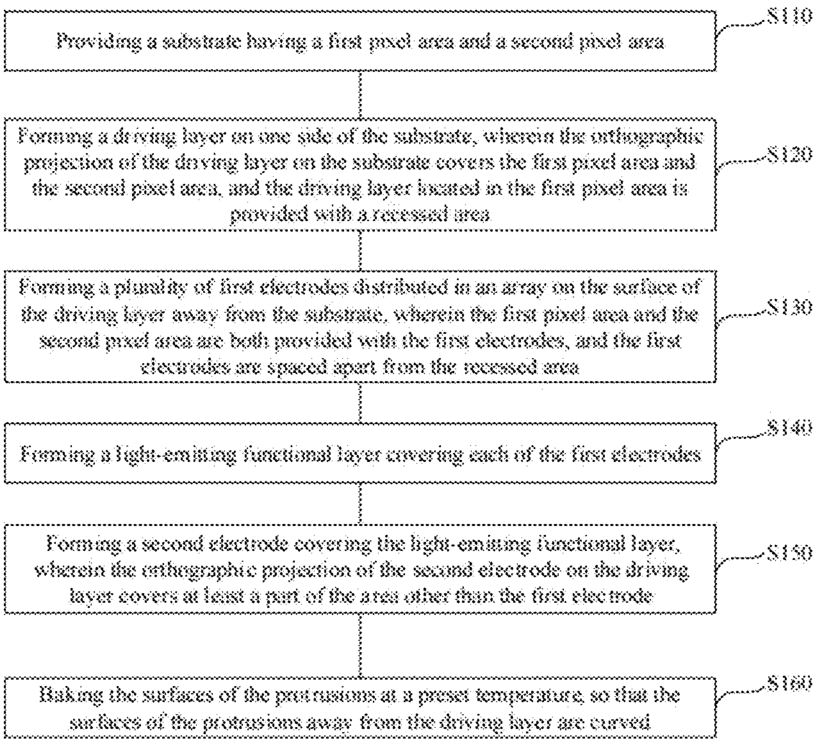
FIG. 15 is a flowchart of a manufacturing method of a display panel in an embodiment of the present disclosure.

The embodiment of the present disclosure also provides a method for manufacturing a display panel. As shown in FIG. 15, the method includes step S110 to step S150, wherein:

Step S110, providing a substrate having a first pixel area and a second pixel area;

Step S120, forming a driving layer on a side of the substrate, wherein the orthographic projection of the driving layer on the substrate covers the first pixel area and the second pixel area, and the driving layer located in the first pixel area is provided with a recessed area;

Step S130, forming a plurality of first electrodes distributed in an array on the surface of the driving layer away from the substrate, wherein the first pixel area and the second pixel area are both provided with the first electrodes, and the first electrodes are spaced apart from the recessed area:

Step S140, forming a light-emitting functional layer covering each of the first electrodes;

Step S150, forming a second electrode covering the light-emitting functional layer, wherein the orthographic projection of the second electrode on the driving layer covers at least a part of the area other than the first electrode.

In addition, in some embodiments of the present disclosure, the manufacturing method of the present disclosure may further include:

Step S160, baking surfaces of the protrusions at a preset temperature, so that the surfaces of the protrusions away from the driving layer is curved.

The curved surface can protrude away from the substrate 1, that is, the protrusion 212 can be in the form of a lens, which helps to improve the forward transmittance of light. In one embodiment, the preset temperature may be 50° C.-100° C. For example, it may be 50° C., 60° C. 70° C., 80° C., 90° C. or 100° C. Of course, it may also be other temperatures, which are not listed one by one here.

The specific details and beneficial effects of the manufacturing method of the embodiment of the present disclosure have been described in the embodiment of the display panel above, so details will not be repeated here.

It should be noted that although the steps of the manufacturing method of the display panel in the present disclosure are described in a specific order in the drawings, this does not require or imply that these steps must be performed in this specific order, or that all the shown steps must be performed to achieve the desired result. Additionally or alternatively, certain steps may be omitted, multiple steps may be combined into one step for execution, and/or one step may be decomposed into multiple steps for execution, etc.

Embodiments of the present disclosure also provide a display device, which may include the display panel in any of the above embodiments, and its structure and beneficial effects may refer to the above embodiment of the display panel, and will not be described in detail here. The display device in the embodiments of the present disclosure may be a device for displaying images such as a mobile phone, a display screen, a tablet computer, a TV, and a micro-display device, which will not be listed here.

Other embodiments of the present disclosure will be readily apparent to those skilled in the art from consideration of the specification and practice of the invention disclosed herein. This application is intended to cover any modification, use or adaptation of the present disclosure, and these modifications, uses or adaptations follow the general principles of the present disclosure and include common knowledge or conventional technical means in the technical field not disclosed in the present disclosure. The specification and embodiments are to be considered exemplary only, with the true scope and spirit of the disclosure indicated by the appended claims.

What is claimed is:

1. A display panel, comprising:

a substrate having a first pixel area and a second pixel area;

a driving layer arranged on a side of the substrate, wherein an orthographic projection of the driving layer on the substrate covers the first pixel area and the second pixel area, and the driving layer located in the first pixel area is provided with recessed areas;

a plurality of first electrodes, distributed in an array on a side of the driving layer away from the substrate, wherein the first pixel area and the second pixel area are both provided with the first electrodes, the first electrodes are spaced apart from the recessed areas, a recessed area is provided between adjacent first electrodes, and a first electrode is provided between adjacent recessed areas;

a light-emitting functional layer covering each of the first electrodes;

a second electrode covering the light-emitting functional layer, wherein an orthographic projection of the second electrode on the driving layer covers at least a part of an area other than the first electrodes.

2. The display panel according to claim 1, wherein the recessed area comprises a plurality of isolation holes distributed at intervals, and the isolation holes extend from a surface of the driving layer away from the substrate to the substrate.

3. The display panel according to claim 2, wherein the isolation holes have a depth of 0~3.5 um.

4. The display panel according to claim 2, wherein a thickness of the second electrode at a bottom of the isolation holes is smaller than a thickness of the second electrode at a surface of the light-emitting functional layer.

5. The display panel according to claim 2, wherein an orthographic projection of the second electrode on the substrate at most partially overlaps with an orthographic projection of the isolation holes on the substrate.

6. The display panel according to claim 2, wherein an angle between the substrate and a boundary of an orthographic projection of a sidewall of the isolation holes on a plane perpendicular to the substrate is 65° ~125°.

7. The display panel according to claim 2, wherein the display panel further comprises:

a buffer layer located between the substrate and the driving layer;

the driving layer comprises a pixel driving circuit, and the pixel driving circuit comprises a plurality of transistors distributed in an array, and the transistors comprises:

an active layer located on a side of the substrate close to the first electrodes;

a first gate insulating layer covering the active layer;

a first gate electrode, disposed on a side of the first gate insulating layer away from the substrate;

a second gate insulating layer covering the first gate electrode and the first gate insulating layer;

an interlayer dielectric layer covering a second gate electrode and the second gate insulating layer;

a source-drain layer formed on a side of the interlayer dielectric layer away from the substrate, and comprising a source electrode and a drain electrode, wherein the source electrode and the drain electrode are respectively connected to both ends of the active layer;

the isolation holes penetrate through the interlayer dielectric layer, the second gate insulating layer, the first gate insulating layer and the buffer layer.

8. The display panel according to claim 1, wherein the driving layer has a plurality of protrusions distributed at intervals on a side away from the substrate, and the plurality of protrusions are located in the first pixel area; the recessed area is an area other than the plurality of protrusions and not covered by the first electrodes.

9. The display panel according to claim 8, wherein a thickness of the second electrode at a gap between two adjacent protrusions is smaller than a thickness of the second electrode at a surface of the light-emitting functional layer.

10. The display panel according to claim 8, wherein an orthographic projection of the second electrode on the substrate at most partially overlaps with an orthographic projection of a gap between two adjacent protrusions on the substrate.

11. The display panel according to claim 8, wherein an angle between the substrate and a boundary of an orthographic projection of a sidewall of the plurality of protrusions on a plane perpendicular to the substrate is 65° ~90°.

12. The display panel according to claim 8, wherein the protrusions are transparent protrusions.

13. The display panel according to claim 8, wherein the display panel further comprises:

a planarization layer disposed on a surface of the driving layer away from the substrate;

the plurality of protrusions are disposed on the same layer as the planarization layer, and a surface of a protrusion of the plurality of the protrusions away from the driving layer protrudes from a surface of the planarization layer away from the driving layer.

14. The display panel according to claim 8, wherein a surface of a protrusion of the plurality of the protrusions away from the driving layer is an arc surface.

15. The display panel according to claim 8, wherein each of the first electrodes is surrounded by a plurality of the plurality of the protrusions.

16. The display panel according to claim 1, wherein a number of the first electrodes located in the first pixel area per unit area is less than a number of the first electrodes located in the second pixel area per unit area.

17. The display panel according to claim 16, wherein the display panel further comprises:

an encapsulation layer located on a side of the second electrode and the recessed area away from the driving layer.

18. A method for manufacturing a display panel, comprising:

providing a substrate having a first pixel area and a second pixel area;

forming a driving layer on a side of the substrate, wherein an orthographic projection of the driving layer on the substrate covers the first pixel area and the second pixel area, and the driving layer located in the first pixel area is provided with a recessed areas;

forming a plurality of first electrodes distributed in an array on a side of the driving layer away from the substrate, wherein the first pixel area and the second pixel area are both provided with the first electrodes, and the first electrodes are spaced apart from the recessed areas, a recessed area is provided between adjacent first electrodes, and a first electrode is provided between adjacent recessed areas;

forming a light-emitting functional layer covering each of the first electrodes;

forming a second electrode covering the light-emitting functional layer, wherein an orthographic projection of the second electrode on the driving layer covers at least a part of an area other than the first electrodes.

19. The method according to claim 18, wherein the driving layer has a plurality of protrusions distributed at intervals on a side away from the substrate, the protrusions are located in the first pixel area, and the recessed area is an area other than the protrusions and not covered by the first electrodes.

20. The method according to claim 19, wherein the method further comprises:

baking surfaces of the protrusions at a preset temperature, so that the surfaces of the protrusions away from the driving layer are curved.

* * * * *